United States Patent
Teh et al.

(10) Patent No.: US 11,449,247 B2
(45) Date of Patent: *Sep. 20, 2022

(54) PERIPHERY SHORELINE AUGMENTATION FOR INTEGRATED CIRCUITS

(71) Applicant: Intel Corporation, Santa Clara, CA (US)

(72) Inventors: Chee Hak Teh, Bayan Lepas (MY); Curtis Wortman, San Jose, CA (US); Jeffrey Erik Schulz, Milpitas, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/953,138

(22) Filed: Nov. 19, 2020

(65) Prior Publication Data

US 2021/0072908 A1 Mar. 11, 2021

Related U.S. Application Data

(63) Continuation of application No. 16/147,150, filed on Sep. 28, 2018, now Pat. No. 10,871,906.

(51) Int. Cl.
*G06F 3/06* (2006.01)
*G06F 13/38* (2006.01)
*G11C 7/10* (2006.01)

(52) U.S. Cl.
CPC .......... *G06F 3/0629* (2013.01); *G06F 3/0679* (2013.01); *G06F 13/385* (2013.01); *G11C 7/1057* (2013.01); *G11C 7/1084* (2013.01)

(58) Field of Classification Search
CPC .................................. G06F 3/06; G06F 13/38
See application file for complete search history.

(56) References Cited

U.S. PATENT DOCUMENTS

| | | |
|---|---|---|
| 6,792,501 B2 | 9/2004 | Chen |
| 7,822,946 B2 | 10/2010 | Sharma |
| 8,213,205 B2 | 7/2012 | Rakan |
| 8,332,552 B2 | 12/2012 | Arimilli et al. |
| 10,424,571 B2 | 9/2019 | Choi et al. |
| 2007/0033337 A1 | 2/2007 | Butt et al. |
| 2009/0290442 A1 | 11/2009 | Rajan |

(Continued)

OTHER PUBLICATIONS

International Search Report and Written Opinion of German Patent Application 10 2019 124 486.2.

*Primary Examiner* — David E Martinez
(74) *Attorney, Agent, or Firm* — Fletcher Yoder, P.C.

(57) ABSTRACT

A multichip package may include at least a main die mounted on a substrate. The main die may be coupled to one or more transceiver dies also mounted on the substrate. The main die may include one or more universal interface blocks configured to interface with an on-package memory device or an on-package expansion die, both of which can be mounted on the substrate. The expansion die may include external memory interface (EMIF) components for communicating with off-package memory devices and/or bulk random-access memory (RAM) components for storing large amounts of data for the main die. Smaller input-output blocks such as GPIO (general purpose input-output) or LVDS (low-voltage differential signaling) interfaces may be formed within the core fabric of the main die without causing routing congestion while providing the necessary clock source.

20 Claims, 9 Drawing Sheets

(56) References Cited

U.S. PATENT DOCUMENTS

| | | |
|---|---|---|
| 2010/0325393 A1 | 12/2010 | Lerzer |
| 2012/0124277 A1 | 5/2012 | Danilak et al. |
| 2012/0203977 A1* | 8/2012 | Shurtz ................... G06F 13/28 |
| | | 711/154 |
| 2013/0046934 A1* | 2/2013 | Nychka ............... G06F 12/0897 |
| | | 711/119 |
| 2013/0087915 A1* | 4/2013 | Warren ................... H01L 24/11 |
| | | 257/738 |
| 2013/0329374 A1* | 12/2013 | Lin ...................... H05K 1/0284 |
| | | 361/728 |
| 2015/0095601 A1 | 4/2015 | Muralimanhar et al. |
| 2016/0163609 A1* | 6/2016 | Rahman ............. G01R 31/2856 |
| | | 324/762.03 |
| 2017/0192686 A1 | 7/2017 | Niu et al. |
| 2018/0239738 A1 | 8/2018 | Teh |
| 2019/0114268 A1 | 4/2019 | Zhu et al. |

* cited by examiner

PERIPHERY SHORELINE AUGMENTATION FOR INTEGRATED CIRCUITS

This application is a continuation of U.S. patent application Ser. No. 16/147,150, filed Sep. 28, 2018, which is hereby incorporated by reference herein in its entirety.

BACKGROUND

This relates generally to integrated circuits and more particularly, to integrated circuit packages with more than one integrated circuit die.

An integrated circuit package typically includes an integrated circuit (IC) die and a substrate on which the die is mounted. The integrated circuit die is coupled to the substrate through bonding wires or solder bumps. Signals from the integrated circuit die travels through the bonding wires or solder bumps to the substrate.

As demands on integrated circuit technology continue to outstrip even the gains afforded by ever decreasing device dimensions, an increasing number of applications demand a packaged solution with more integration than is possible in one silicon die. In an effort to meet this need, more than one IC die may be placed within an integrated circuit package (i.e., a multichip package). As different types of devices cater to different types of applications, more IC dies may be required in some systems to meet the requirements of high performance applications. Accordingly, to obtain better performance and higher density, a multichip package may include multiple dies arranged laterally along the same plane or may include multiple dies stacked on top of one another.

In such multichip package solutions, a multichip package will typically include a main logic die, transceiver dies, and high bandwidth memory (HBM) dies all mounted on a common interposer substrate within the multichip package. In such scenarios, the main logic die has to include transceiver input/output (IO) components for interfacing with the transceiver dies, HBM input/output components for interfacing with the high bandwidth memory dies, additional memory input/output components for interfacing with memory devices external to the multichip package, large embedded static random-access memory (eSRAM) blocks, and a secure device manager in charge of configuring or programming the main logic die (if the main die is a programmable logic device). The transceiver IO components, HBM IO components, additional memory IO components, eSRAM blocks, and the secure device manager should all be placed along the periphery of the main die for optimal performance and therefore compete for the limited shoreline on the main logic die.

It is within this context that the embodiments described herein arise.

DETAILED DESCRIPTION

The present embodiments relate to integrated circuits and more particularly, to augmenting the shoreline (or the peripheral edge) of an integrated circuit die to accommodate a wide variety of input-output elements. Shoreline augmentation can be achieved by moving peripheral components with higher performance requirements such as external memory interface (EMIF) components and bulk random-access memory (RAM) components off the integrated circuit die off onto an associated expansion module. The integrated circuit die may include a universal interface block operable to communicate with the off-chip expansion tile or a high bandwidth memory stack. Both the expansion tile and the high bandwidth memory stack may be formed within the same package as the integrated circuit die.

Augmenting the integrated circuit shoreline in this way can expand the number of input-output components by 2× or more through the expansion tile extension, decouple new external memory standards from the design cadence of the integrated circuit (which enables faster time to market), allow the EMIF and bulk RAM components on the expansion module to scale independently of the integrated circuit, provide increased flexibility to connect with high bandwidth memory modules without impeding core fabric performance of the integrated circuit, and restore the clock source count within the core fabric of the integrated circuit while preserving all necessary periphery IO components along the shoreline of the integrated circuit to ensure that the core fabric routing remains regular and unperturbed for maximum operating frequency.

It will be recognized by one skilled in the art, that the present exemplary embodiments may be practiced without some or all of these specific details. In other instances, well-known operations have not been described in detail in order not to unnecessarily obscure the present embodiments.

Figure 1:
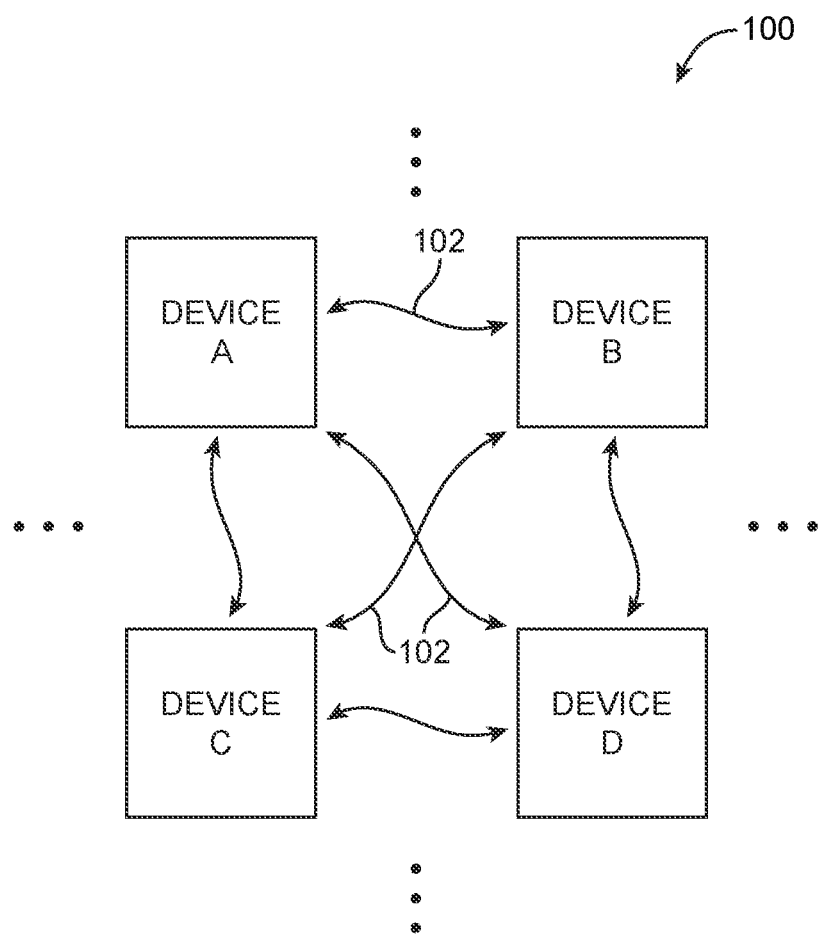
FIG. 1 is a diagram of an illustrative system of integrated circuit devices operable to communicate with one another in accordance with an embodiment.

FIG. 1 is a diagram of an illustrative system 100 of interconnected electronic devices. The system of interconnected electronic devices may have multiple electronic devices such as device A, device B, device C, device D, and interconnection resources 102. Interconnection resources 102 such as conductive lines and busses, optical interconnect infrastructure, or wired and wireless networks with optional intermediate switching circuitry may be used to send signals from one electronic device to another electronic device or to broadcast information from one electronic device to multiple other electronic devices. For example, a transmitter in device B may transmit data signals to a receiver in device C. Similarly, device C may use a transmitter to transmit data to a receiver in device B.

The electronic devices may be any suitable type of electronic device that communicates with other electronic devices. Examples of such electronic devices include integrated circuits having electronic components and circuits such as analog circuits, digital circuits, mixed-signal circuits, circuits formed within a single package, circuits housed within different packages, circuits that are interconnected on a printed-circuit board (PCB), etc.

Figure 2:
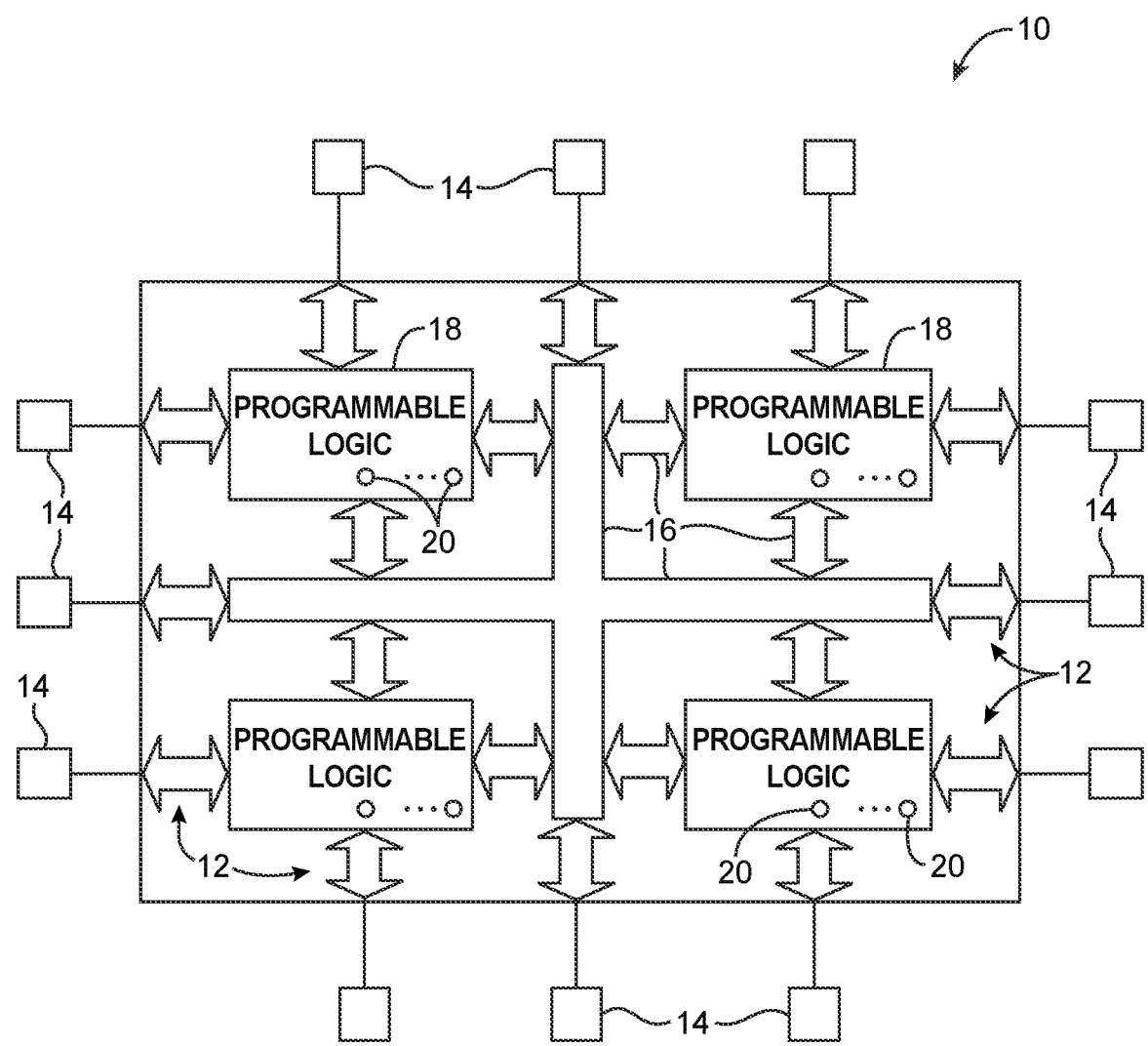
FIG. 2 is a diagram of an illustrative programmable integrated circuit in accordance with an embodiment.

In accordance with an embodiment, an integrated circuit may be a programmable integrated circuit such as programmable integrated circuit 10 of FIG. 2. Programmable integrated circuit 10 may be configured to implement a variety of different functions. As shown in FIG. 2, integrated circuit 10 may contain memory elements 20. Memory elements 20 may be loaded with configuration data to configure programmable transistors such as pass transistors (sometimes referred to as pass gates or pass gate transistors) in programmable circuitry such as programmable logic 18.

Because memory elements 20 may be used to store configuration data for programmable logic 18, memory elements 20 may sometimes be referred to as configuration random-access memory (CRAM) cells. Integrated circuit 10 may be configured to implement custom logic functions by configuring programmable logic 18. Integrated circuit 10 of this type is sometimes referred to as a programmable integrated circuit, a programmable logic device (PLD), or a field-programmable gate array (FPGA) device.

As shown in FIG. 2, programmable integrated circuit 10 may have input-output (I/O) circuitry 12 for driving signals off of device 10 and for receiving signals from other devices via input-output pins 14. Interconnection resources 16 such as global and local vertical and horizontal conductive lines and buses may be used to route signals on device 10. Interconnection resources 16 may include fixed interconnects (conductive lines) and programmable interconnects (i.e., programmable connections between respective fixed interconnects).

As integrated circuit fabrication technology scales towards smaller process nodes, it becomes increasingly challenging to design an entire system on a single integrated circuit die (sometimes referred to as a system-on-chip). Designing analog and digital circuitry to support desired performance levels while minimizing leakage and power consumption can be extremely time consuming and costly.

One alternative to single-die packages is an arrangement in which multiple dies are placed within one package. Such types of packages that contain multiple interconnected dies may sometimes be referred to as systems-in-package (SiPs), multichip modules (MCM), or multichip packages. Placing multiple chips (dies) within a single package may allow each die to be implemented using the most appropriate technology node, may increase the performance of die-to-die interface (e.g., driving signals from one die to another within a single package is substantially easier than driving signals from one package to another, thereby reducing power consumption of associated input-output buffers), may free up input-output pins (e.g., input-output pins associated with die-to-die connections are much smaller than pins associated with package-to-board connections), and may help simplify printed circuit board (PCB) design (i.e., the design of the PCB on which the multi-chip package is mounted during normal system operation).

Figure 3:
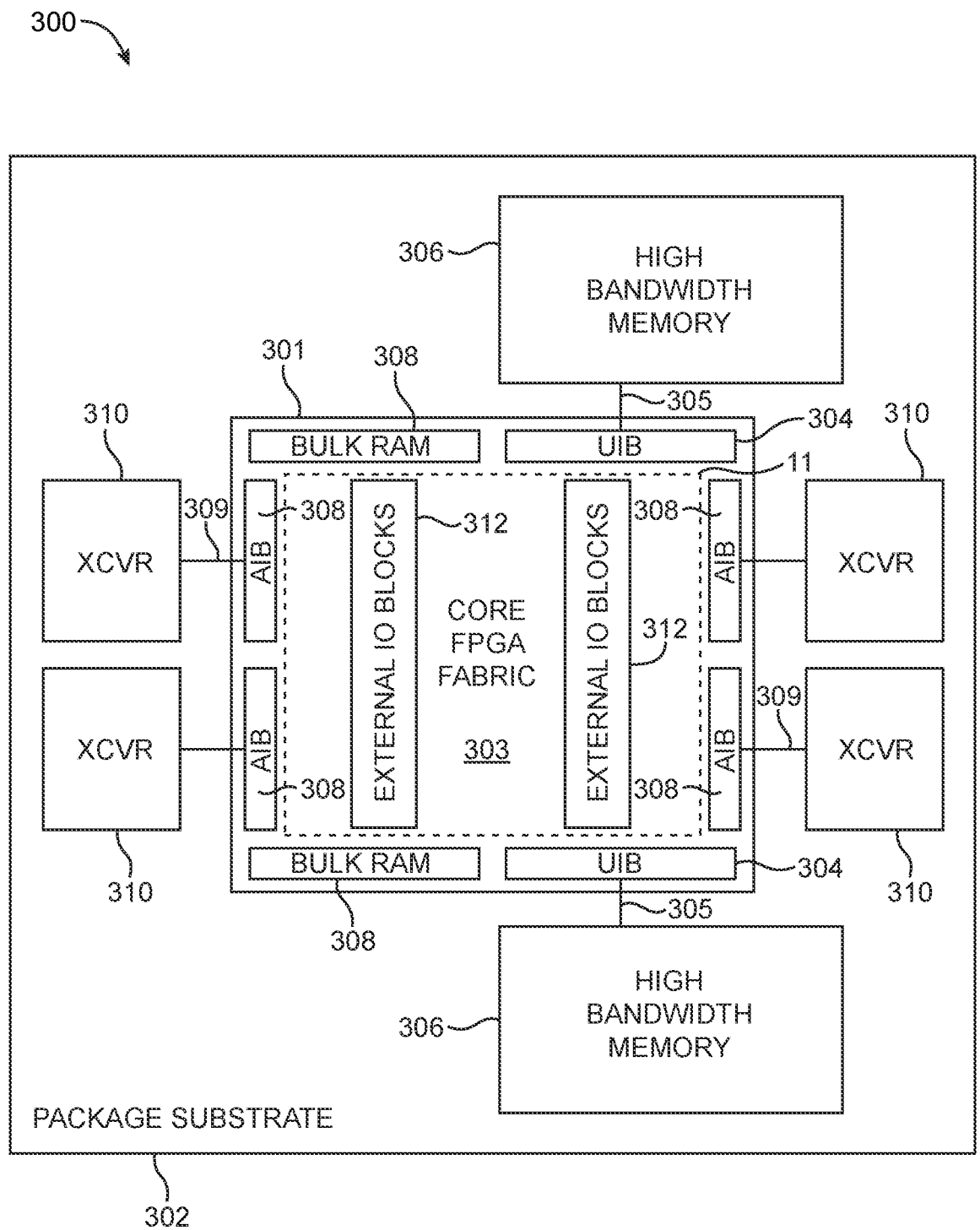
FIG. 3 is a top layout view of a multichip package that includes a main die having external memory input-output blocks formed within the core fabric of the main die.

FIG. 3 is a diagram of an illustrative multichip package 300. As shown in FIG. 3, multichip package 300 may include one or more integrated circuit dies such as an integrated circuit (IC) die 301, transceiver (XCVR) dies 310, and high bandwidth memory (HBM) dies 306 mounted on a common package substrate 302. Substrate 302 may be a passive silicon substrate, an active silicon substrate (e.g., a substrate that includes transistors for assisting operations on the main die), or other interposer substrate carrier. This arrangement in which multiple dies are mounted on a common package substrate may sometimes be referred to as a "2.5D" arrangement. Integrated circuit die 301 that provides the main processing power for package 300 may be referred to as the "main" die, whereas electronic components other than main die 301 such as dies 306 and 310 may be referred to as "daughter" or auxiliary dies.

Main IC die 301 may, for example, be a programmable integrated circuit such a field-programmable gate array (FPGA) device of the type shown in connection with FIG. 2. Main die 301 may include on-package interconnect circuitry such as the proprietary Advanced Interface Blocks (AIBs) 308 developed by INTEL Corporation for communicating with transceiver dies 310 via bus 309. Bus 309 is sometimes referred to as the Advanced Interface Bus or the ALTERA Interface Bus. Transceiver dies 310 may be configured to transmit and receive signals to and from components external to package 300 and to support high-speed data communications (e.g., at data rates of more than 10 Gbps, more than 50 Gbps, or more than 100 Gbps, etc.) over 1-16 lanes with the off-package components (as an example). The example of FIG. 3 in which AIBs 308 for interfacing with transceiver dies 310 are formed along the east and west peripheral edges (shoreline) of die 301 is merely illustrative. In general, AIBs 308 may be formed along any number or portion of edges on die 301.

In the example in which main die 301 is an FPGA device (e.g., programmable logic device 10 of FIG. 2), the FPGA may include logic circuitry having lookup tables (LUTs), adders, and registers that are configurable to allow a user to customize the logic circuitry according to the user's particular needs. The logic circuitry is organized into an array of logic regions sometimes referred to as logic array blocks (LABs). In addition to the logic circuitry, the FPGA also includes memory blocks for storing user data and digital signal processing (DSP) blocks that are partly or fully hardwired to perform one or more specific tasks such as a mathematical operation. In addition to the configurable logic, memory, and DSP blocks, the FPGA also includes programmable routing fabric that is used to interconnect the LABs with the memory and DSP blocks (see, e.g., core routing fabric 303 in FIG. 3). The combination of the programmable logic and routing fabric is sometimes referred to as "soft" logic, whereas the DSP blocks are sometimes referred to as "hard" logic. As shown in FIG. 3, FPGA core fabric 303 may be formed throughout main device 301 within the shoreline peripheral blocks.

Main die 301 may further include external input-output (IO) blocks such as external IO blocks 312. External IO blocks 312 may support wide parallel interfaces such as external memory interfaces (EMIF) or more generic interfaces like GPIO (general purpose input-output) or LVDS (low-voltage differential signaling) interfaces. External memory interfaces that are supported by blocks 312 may include double data rate (DDR) interfaces such as DDR type-3 (DDR3), low power DDR3 (LPDDR3), DDR type-4 (DDR4), low power DDR4 (LPDDR4), DDR type-5 (DDR5), graphics DDRx, quad data rate (QDR), Open NAND Flash Interface (ONFI), or other suitable interfaces for communicating with memory that is external to package 300. Blocks 312 may therefore include memory controllers for supporting a wide variety of external memory protocols.

Main die 301 may also include on-package interconnect circuitry such as universal interface blocks (UIBs) 304 for communicating with on-package components such as memory dies 306 via bus 305. Bus 305 is therefore sometimes referred to as a universal interface bus. As examples, memory dies 306 may be implemented using random-access memory such as static random-access memory (SRAM), dynamic random-access memory (DRAM), low latency DRAM (LLDRAM), reduced latency DRAM (RLDRAM), or other types of volatile memory. If desired memory dies 306 may also be implemented using nonvolatile memory (e.g., fuse-based memory, antifuse-based memory, electrically-programmable read-only memory, etc.). Configured in this way, each block 304 may serve as a physical-layer bridging interface between an associated memory controller (e.g., a non-reconfigurable "hard" memory controller or a reconfigurable "soft" memory controller logic) on the main die 301 and one or more high-bandwidth channels that is coupled to an associated memory die 306. In general, universal interface block 304 may be capable of supporting a wide variety of communications protocols, which are not limited to memory interface protocols, for interfacing with different types of daughter dies.

In accordance with an embodiment, UIBs 304 can be used to support multiple parallel channel interfaces such as the JEDEC JESD235 High Bandwidth Memory (HBM) DRAM interface or the Quad Data Rate (QDR) wide IO SRAM interface (as examples). In contrast to external IO blocks 312 that can support EMIF interfaces having at most three to four DDR channels, UIB 304 is able to support more than four memory channels, four to eight memory channels, eight to 16 memory channels, or more than 16 memory channels. Each of the parallel channels can support single data rate (SDR) or double data rate (DDR) communications. Compared to IO block 312, UIB 304 can therefore support much higher bandwidth communications.

In addition to the memory blocks that are formed throughout the core of main die 301, die 301 may further include much larger random-access memory blocks sometimes referred to as embedded static random-access memory (eSRAM) blocks or "bulk" RAM blocks 308. The bulk RAM blocks 308 tend to be much larger and denser than the core memory blocks and thus are not suitable to be placed within core fabric 303. As a result, bulk RAM blocks 308 should be placed at the peripheral edge of die 301 and therefore compete with the valuable shoreline with the other IO components such as AIBs 308 and UIBs 304. The example of FIG. 3 in which bulk RAM blocks 308 are formed along the north and south shorelines of die 301 is merely illustrative. In general, RAM blocks 308 may be formed along any number or portion of edges on die 301.

Still referring to the example of FIG. 3, the external IO blocks 312 are cascaded into long columns within the FPGA core fabric 303 (see two IO columns in FIG. 3). Each individual external IO block 312 may include a phase-locked loop (PLL) circuit that serves as a clock source for the external memory interfaces or as general-purpose clock sources for the FPGA core fabric 303. To scale to higher operating frequencies, however, IO blocks 312 that originally reside in the FPGA core fabric 303 (as shown in FIG. 3) may need to be moved to the FPGA shoreline to improve the parallel package trace connectivity to external devices, to improve clocking structures across the different IO blocks 312, and to reduce routing congestion caused by the long obstructing columns, which improves the maximum operating frequency of the core fabric.

Figure 4:
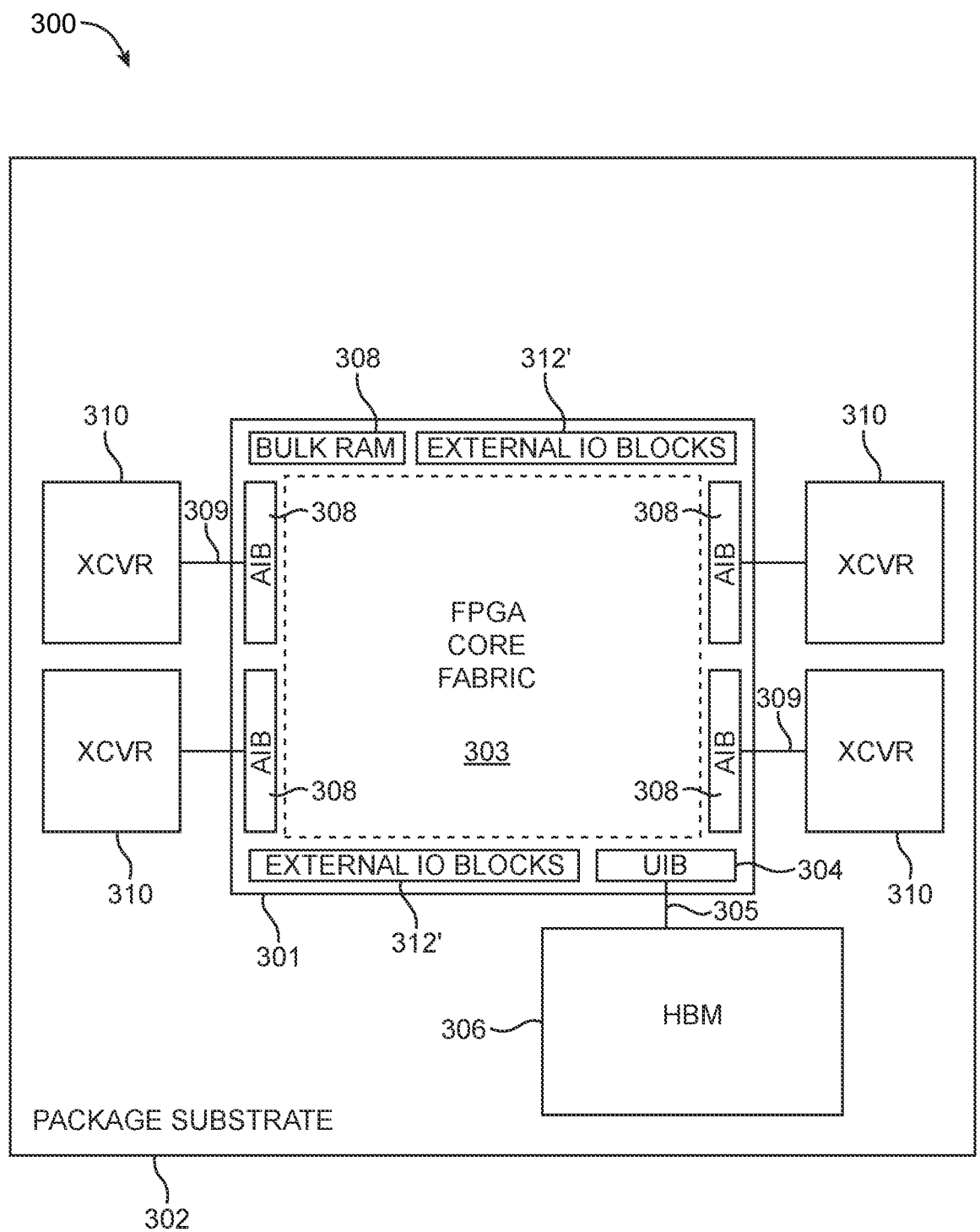
FIG. 4 is a top layout view of a multichip package that includes a main die having external memory input-output blocks formed along the shoreline of the main die.

FIG. 4 shows another example where the universal interface block 304 and the bulk RAM block 308 at the north shoreline have been removed to make room for external IO blocks 312'. Configured in this way, large IO block columns 312 no longer need to be formed through the FPGA core fabric 303, which can increase the performance of the core fabric. However, this gain comes with the cost of significant bandwidth loss (since one HBM die 306 has to be dropped) and density loss (assuming the size of bulk RAM block 308 has to be shrunken accordingly to fit blocks 312'), not to mention a reduced number of PLL clock sources for the core fabric 303. These drawbacks may be undesirable as different FPGA market segments demand different combinations of IO, HBM, and bulk SRAM. As an example, some market segments such as networking applications need more HBM and bulk RAM bandwidth and storage, so the solution of FIG. 4 would not be acceptable. To complicate matters further, new EMIF standards are becoming increasingly complex and tend to march at a different pace relative to the design cadence of the main die 301, which can cause time-to-market (TTM) issues.

Figure 5A:
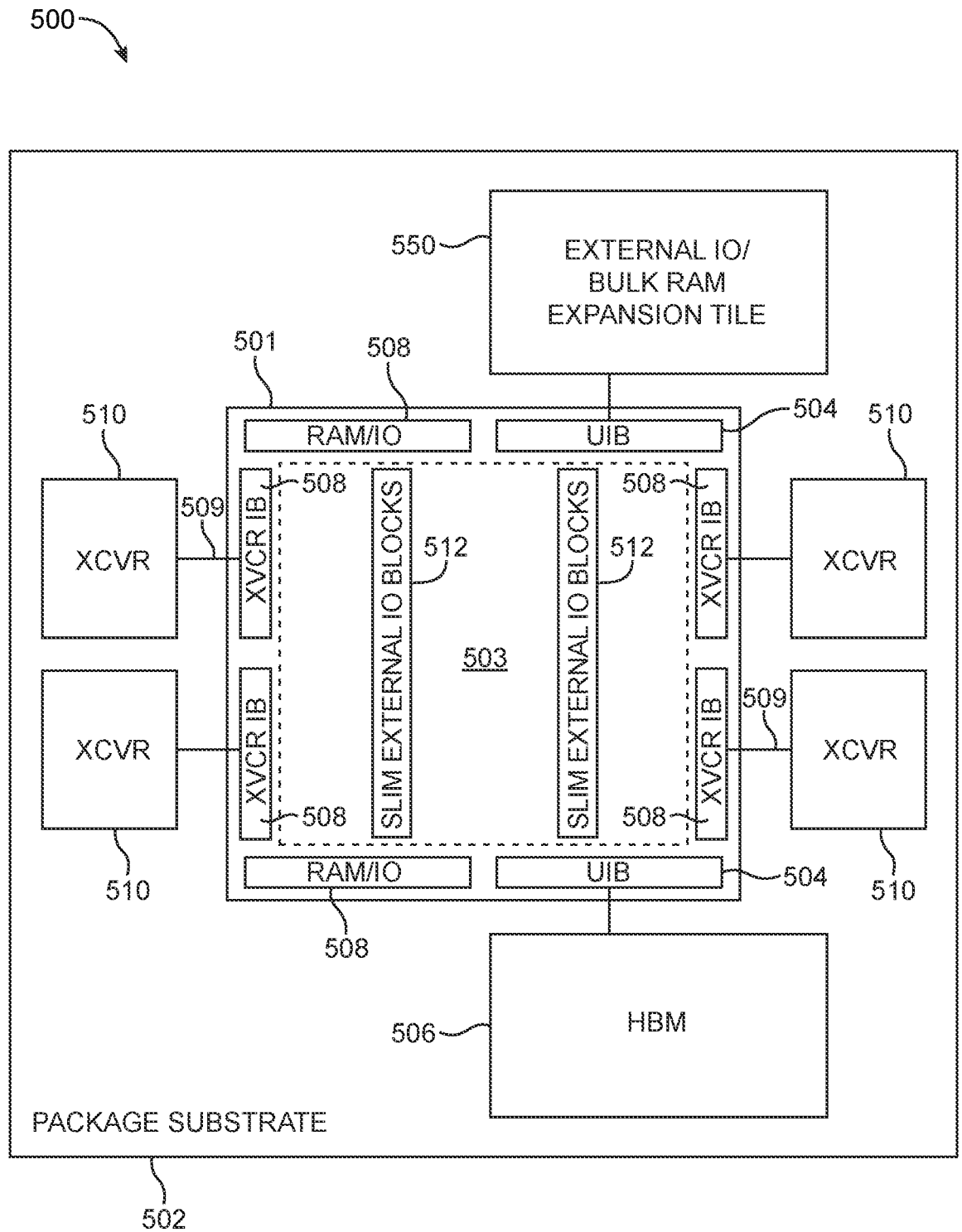
FIG. 5A is a diagram of an illustrative multichip package showing how external memory input-output blocks and bulk memory blocks are offloaded from the main die onto an expansion tile in accordance with an embodiment.

In accordance with an embodiment, at least some of the EMIF components and/or the bulk RAM components are moved off the main die onto an associated daughter/auxiliary die (see, e.g., FIG. 5A). FIG. 5A is a diagram of an illustrative multichip package 500. As shown in FIG. 5A, multichip package 500 may include one or more integrated circuit dies such as main die 501, transceiver (XCVR) dies 510, high bandwidth memory (HBM) die 506, and expansion tile 550 mounted on a common package substrate 502. Substrate 502 may be a passive silicon substrate, an active silicon substrate (e.g., a substrate that includes transistors for assisting operations on the main die), or other interposer substrate carrier. In general, package 500 may include any type of daughter dies not limited to transceiver chips, memory chips, networking adapters, discrete passive components, debugging circuits, or other types of processing circuits.

Main IC die 501 may be any suitable integrated circuit such as a programmable integrated circuit (e.g., programmable device 10 of FIG. 2), an application-specific standard product (ASSP), or an application-specific integrated circuit (ASIC). Examples of programmable logic devices include programmable arrays logic (PALs), programmable logic arrays (PLAs), field programmable logic arrays (FPLAs), electrically programmable logic devices (EPLDs), electrically erasable programmable logic devices (EEPLDs), logic cell arrays (LCAs), complex programmable logic devices (CPLDs), and field programmable gate arrays (FPGAs), just to name a few.

Main die 501 may include on-package interconnect circuitry such as transceiver interface blocks 508 (e.g., proprietary Advanced Interface Blocks developed by INTEL/ALTERA Corporation) for communicating with transceiver dies 510 via bus 509 (e.g., an Altera Interface Bus). Transceiver dies 510 may be configured to transmit and receive signals to and from components external to package 500 and to support high-speed data communications (e.g., at data rates of more than 10 Gbps, more than 50 Gbps, or more than 100 Gbps, etc.) over 1-16 lanes with the off-package components (as an example). The example of FIG. 5A in which XCVR interface blocks 508 for interfacing with transceiver dies 510 are formed along the east and west shorelines of die 501 is merely illustrative. In general, interface blocks 508 may be formed along any number or portion of edges on die 501.

Configured in this way, transceiver dies 510 and main die 501 need not be manufactured using the same process node, which enables an in-package integration scheme that is easily scalable and allows designers to quickly mix-and-match components from different process nodes that best fit customers' need. Using separate proven transceiver dies 510 rather than on-chip transceivers can also help significantly reduce validation and bring-up times and dramatically improve customers' time-to-market metrics. Transceiver dies 510 may each be a hard IP (intellectual property) block that is capable of supporting communications protocols including but not limited to current and future versions of Ethernet, Interlaken, PCIe (Peripheral Component Interconnect Express), IEEE 1588, CPRI (Common Public Radio Interface), etc.

In the example in which main die 501 is an FPGA device (e.g., programmable logic device 10 of FIG. 2), the FPGA may include logic circuitry having lookup tables (LUTs), adders, and registers that are configurable to allow a user to customize the logic circuitry according to the user's particular needs. The logic circuitry may be organized into an array of logic regions sometimes referred to as logic array blocks (LABs). In addition to the logic circuitry, the FPGA may also include memory blocks for storing user data and specialized processing blocks sometimes referred to as digital signal processing (DSP) blocks that are partly or fully hardwired to perform one or more specific tasks such as a mathematical operation. In addition to the configurable logic, memory, and DSP blocks, the FPGA may also include programmable routing fabric that is used to interconnect the LABs with the memory and DSP blocks (see, e.g., core routing fabric 303 in FIG. 3). The combination of the programmable logic and routing fabric is sometimes referred to as "soft" logic, whereas the DSP blocks are sometimes referred to as "hard" logic. As shown in FIG. 5A, core routing fabric 503 may be formed throughout main device 501 within the shoreline peripheral blocks.

Main die 501 may also include on-package interconnect circuitry such as universal interface blocks 504. Universal interface blocks 504 are operable to communicate with either in-package memory daughter dies such as HBM die 506 or expansion dies such as expansion tile 550. External IO blocks (e.g., EMIF components configured to interface with off-package memory) and/or bulk RAM circuitry (e.g., embedded SRAM blocks) may be formed as part of a daughter die sometimes referred to as an IO/RAM expansion tile or expansion die 550.

The EMIF components within expansion die 550 may support double data rate (DDR) interfaces such as DDR type-3 (DDR3), low power DDR3 (LPDDR3), DDR type-4 (DDR4), low power DDR4 (LPDDR4), DDR type-5 (DDR5), quad data rate (QDR), Open NAND Flash Interface (ONFI), or other suitable interfaces for communicating with memory that is external to package 500. The bulk RAM blocks formed within die 550 may be much larger and denser than the core memory blocks within main die 501 and thus are not suitable to be placed within core fabric 303. In one suitable embodiment, bulk RAM on tile 550 may serve as memory cache for processor die 501. In the example of FIG. 5A, expansion die 550 may be configured to interface with main die 501 via universal interface block 504 on the north shoreline.

Different memory technologies may support higher voltages better suited for older technology nodes and may require higher voltage rails. The expansion die 550 could provide decoupling of power balls isolating the memory interface requiring different voltage rails to die 550. This decoupling would simplify the main die to reduce the number of voltage rails and unique power bumps, which yields better power supply for the main die. Moreover, expansion die 550 could help spread thermal hotspots as analog circuitry typically consumes a large portion of the package power budget.

As described above, universal interface block 504 may also be configured to communicate with memory die 506 (see UIB 504 on the south shoreline of die 501). As examples, memory die 506 may be implemented using random-access memory such as static random-access memory (SRAM), dynamic random-access memory (DRAM), low latency DRAM (LLDRAM), reduced latency DRAM (RLDRAM), or other types of volatile memory. If desired memory die 506 may also be implemented using nonvolatile memory (e.g., fuse-based memory, antifuse-based memory, electrically-programmable read-only memory, etc.). Configured in this way, UIB 504 may serve as a physical-layer bridging interface between an associated memory controller (e.g., a non-reconfigurable "hard" memory controller or a reconfigurable "soft" memory controller logic) on the main die 501 and one or more high-bandwidth channels that is coupled to an associated memory die 506. In general, universal interface block 504 may be capable of supporting a wide variety of communications protocols, which are not limited to memory interface protocols, for interfacing with different types of daughter dies.

In one suitable arrangement, UIB 504 can be used to support multiple parallel channel interfaces such as the JEDEC JESD235 High Bandwidth Memory (HBM) DRAM interface or the Quad Data Rate (QDR) wide IO SRAM interface (as examples). In contrast to conventional EMIF interfaces having at most three to four DDR channels, UIB 504 is capable of supporting more than four memory channels, four to eight memory channels, eight to 16 memory channels, or more than 16 memory channels. Each of the parallel channels can support single data rate (SDR) or double data rate (DDR) communications. Thus, UIB 504 can therefore support much higher bandwidth communications than traditional EMIF components.

In the example of FIG. 5A, each UIB 504 may be implemented as a hard intellectual property (IP) block that is embedded within main die 501. In yet other suitable arrangements, UIB 504 may be embedded in substrate 502 or other parts of multichip package 500. Configured in this way, UIB 504 enables low-latency, high capacity/density, high random transaction rate (RTR) throughput that is at least equal to external SRAM performance and/or high capacity storage compatible with external RLDRAMs or DDRx DRAMs with reduced power. The example of FIG. 5A in which UIBs 504 for interfacing with HBM dies 306 are formed along the north and south shorelines of die 501 is merely illustrative. In general, UIBs 504 may be formed along any number or portion of edges on die 501.

The example of FIG. 5A in which the north UIB 504 is coupled to an EMIF/RAM expansion die 550 and the south UIB 504 is coupled to an HBM die 506 is merely illustrative and is not intended to limit the scope of the present embodiments. In another suitable arrangement, both north and south UIBs 504 may be configured to communicate with HBM dies 506 (e.g., to support applications with greater HBM storage requirements). In yet another suitable arrangement, both north and south UIBs 504 may be configured to communicate with EMIF/RAM expansion dies 550 (e.g., to support applications with greater EMIF connectivity or bulk RAM requirements). The combination of either an expansion tile 550 or an HBM die 506 that is coupled to each UIB 504 on main die 501 may be chosen as part of the packaging selection instead of during development of main die 501.

In contrast to the example of FIG. 3 in with the EMIF IO components are formed in columns 312 within the FPGA core fabric 303, most of the EMIF IO components will be offloaded to expansion die 550 in the embodiment of FIG. 5A. The EMIF IO components on expansion die 550 could include a memory controller and a memory management unit in addition to the IO buffers themselves. However, the more basic IO buffers such as GPIO (general purpose input-output) or LVDS (low-voltage differential signaling) interfaces may still be formed as "slim" external IO columns 512 within core fabric 503. The GPIO/LVDS buffers in columns 512 can still provide basic IO connectivity for die 501 while PLL circuits within columns 512 provide the necessary clock signal source for core routing fabric 503. Columns 512 of FIG. 5A are much smaller or slimmer than columns 312 of FIG. 3 (since the EMIF IO buffers are ejected to expansion die 550), columns 512 will not perturb or cause undesired routing congestion within core fabric 503.

Still referring to FIG. 5A, the remaining periphery edge(s) of main die 501 may be optionally populated with RAM/IO blocks 508 as needed. Blocks 508 may include bulk RAM components (e.g., eSRAM blocks), and/or other high-speed IOs (e.g., DDRx, LPDDRx, GDDRx, QDR, or other EMIF IO components) suitable for placement along the shoreline of main die 501. RAM block 508 residing on the main die 501 next to UIB 504 can also perform a caching function for on-die memory transactions to provide a latency improvement. In contrast, memory transactions made through UIB 504 may experience greater latency. Configured in this way, core fabric 503 could utilize an Advanced Extension Interface (AXI) cross interconnect (as an example) to access RAM blocks 508 or the UIB interfaces (either in cached mode or direct mode) to provide flexible addressing. The UIBs 504 may have digital memory controllers to support different EMIF types for expansion die 550 (e.g., DDRx or QDR) or bypassable to allow further/different memory technologies (e.g., GDDR6).

Configuring multichip package 500 in the way shown in FIG. 5A, the shoreline of main die 501 is augmented to accommodate an increased number of periphery IO blocks. Offloading the EMIF IO blocks onto expansion die 550 decouples new external memory standards from the development cadence of main die 501, which allows for substantially faster time-to-market (TTM) for main die 501 (e.g., the design of FPGA 501 can stay the same while only expansion tile 550 is updated to keep up with new DDR or QDR standards). The EMIF and bulk RAM blocks in expansion die 550 can also scale independently of the architecture of die 501, the process technology that is used to fabricate die 501 (e.g., main die 501 may be manufactured using a newer or older technology node than the daughter dies), and the physical constraints associated with die 501.

The ability of expansion die 550 to interface with UIB 504 provides main die 501 with the much-needed IO connectivity and flexibility for package 500 to accommodate HBM dies 506 without impeding the core fabric performance. The use of slim external IO blocks 512 also helps restore the required clock source count within core routing fabric 503. If desired, other related techniques may be implemented to preserve all periphery IP blocks along the shoreline of die 501 while ensuring that the core fabric routing 503 remains regular, uncongested, and optimized for maximum operating frequency.

Figure 5B:
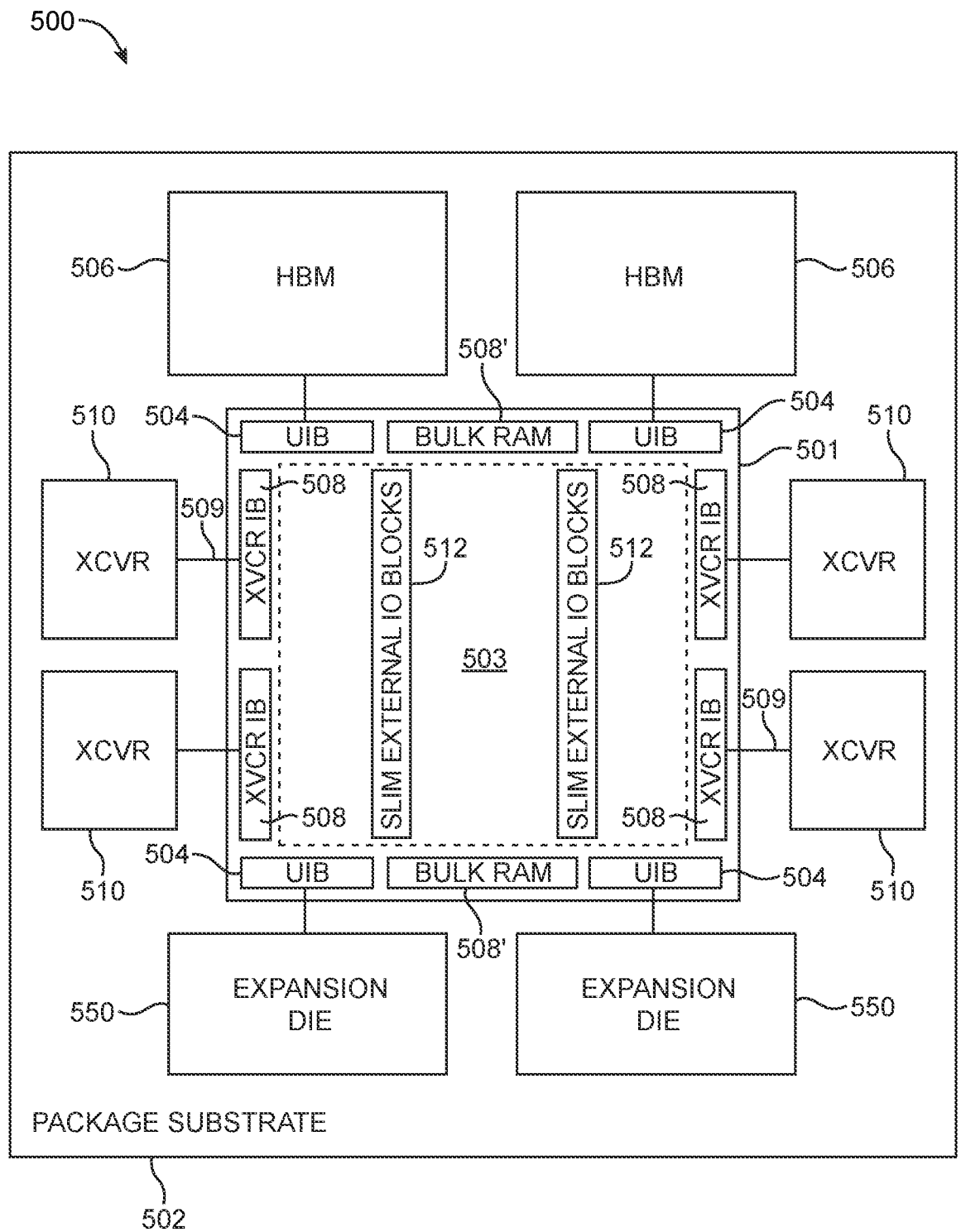
FIG. 5B is a diagram of an illustrative multichip package having more than two universal interface blocks in accordance with an embodiment.

The example of FIG. 5A in which main die 501 includes two UIBs 504 is merely illustrative. FIG. 5B shows another suitable arrangement in which main die 501 includes more than two UIBs 504. As shown in FIG. 5B, a first UIB 504 may be formed along the northwest shoreline of die 501, a second UIB 504 may be formed along the northeast shoreline of die 501, a third UIB 504 may be formed along the southwest shoreline of die 501, and a fourth UIB 504 may be formed along the southeast shoreline of die 501. If desired, main die 501 may be provided with even more universal interface blocks operable to interface with HBM components 506, expansion tile 550, and other daughter dies.

The first and second UIBs 504 along the north shoreline may be coupled to first and second HBM dies 506, respectively. The third and fourth UIBs 504 along the south shoreline may be coupled to first and second expansion dies 550, respectively. This is merely illustrative. If desired, all four UIBs 504 may be coupled to HBM components 506, all four UIBs 504 may be coupled to expansion tiles 550, any subset of UIBs 504 may be coupled to HBM dies 506, and any subset of UIBs 504 may be coupled to expansion dies 550.

In general, UIBs 504 may occupy a relatively small footprint on main die 504 (i.e., the width of UIB 504 may be substantially smaller than the width of HBM die 506 or expansion die 550). The remaining shoreline of main die 501 may be optionally populated with RAM blocks 508' (or optionally EMIF IO blocks) as needed. RAM blocks 508' residing on the main die 501 next to UIBs 504 can serve as bulk RAM (e.g., eSRAM) or can be used to perform a caching function for on-die memory transactions to provide a latency improvement. Configured in this way, core fabric 503 could utilize an Advanced Extension Interface (AXI) cross interconnect (as an example) to access RAM blocks 508' or the UIB interfaces (either in cached mode or direct mode) to provide flexible addressing. The UIBs 504 may have digital memory controllers to support different EMIF types for expansion die 550 (e.g., DDRx or QDR) or bypassable to allow further/different memory technologies (e.g., GDDR6).

Figure 6A:
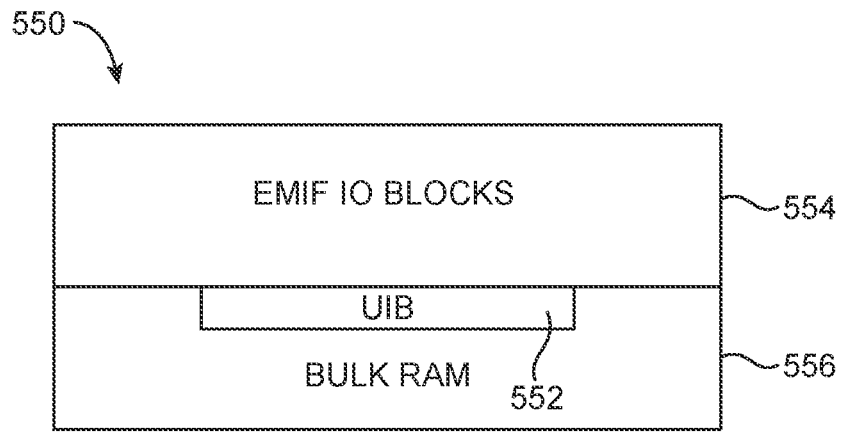
FIG. 6A is a diagram of an illustrative expansion tile that includes external memory interface input-output blocks and bulk random-access memory (RAM) in accordance with an embodiment.

As described above, expansion die 550 may include bulk RAM circuitry and/or EMIF IO circuitry for supporting DDR technologies like DDRx, LPDDRx, and GDDRx, QDR technologies, and/or other external memory IO standards. FIG. 6A is a diagram of an illustrative expansion tile 550 that includes both EMIF IO and bulk RAM circuitry in accordance with an embodiment. As shown in FIG. 6A, expansion die 550 also includes an embedded UIB 552 (e.g., a hard IP block) for interfacing with the corresponding UIB 504 on main die 501. Expansion die 550 may include any suitable number of EMIF IO blocks and bulk RAM blocks. Expansion die 550 may include more EMIF IO blocks than bulk RAM blocks (e.g., for applications requiring more external memory interconnectivity) or may include more bulk RAM blocks than EMIF IO blocks (e.g., for applications requiring more eSRAM storage).

Figure 6B:
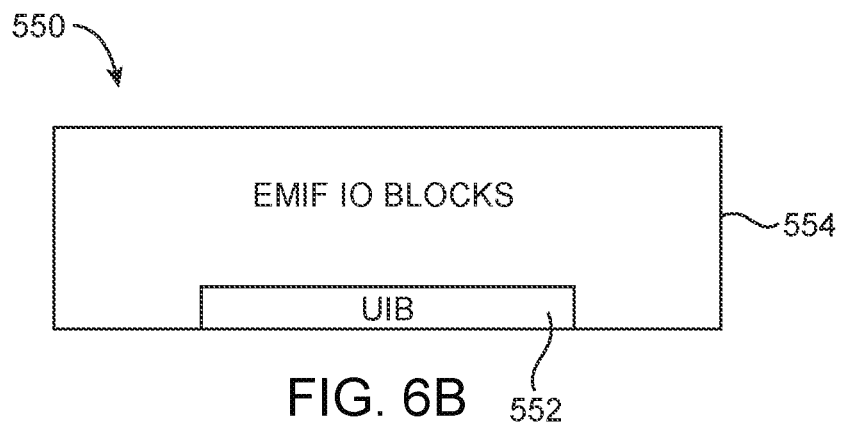
FIG. 6B is a diagram of an illustrative expansion tile that includes only external memory interface input-output blocks in accordance with an embodiment.

In another suitable arrangement, expansion tile 550 might include only EMIF IO blocks (see, e.g., FIG. 6B). In the example of FIG. 6B, expansion die 550 includes UIB 552 configured to interface with UIB 504 on main die 501 and any suitable number of EMIF IO blocks configured to interface with off-package memory devices.

Figure 6C:
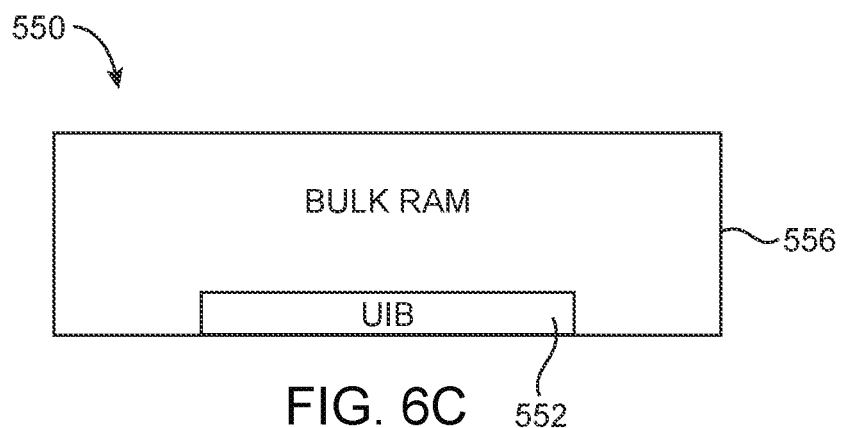
FIG. 6C is a diagram of an illustrative expansion tile that includes only bulk random-access memory in accordance with an embodiment.

In yet another suitable arrangement, expansion tile 550 might include only bulk RAM circuitry (see, e.g., FIG. 6C). In the example of FIG. 6C, expansion die 550 includes UIB 552 configured to interface with UIB 504 on main die 501 and any suitable number of bulk RAM blocks configured to provide additional shoreline storage capacity for die 501.

Figure 7A:
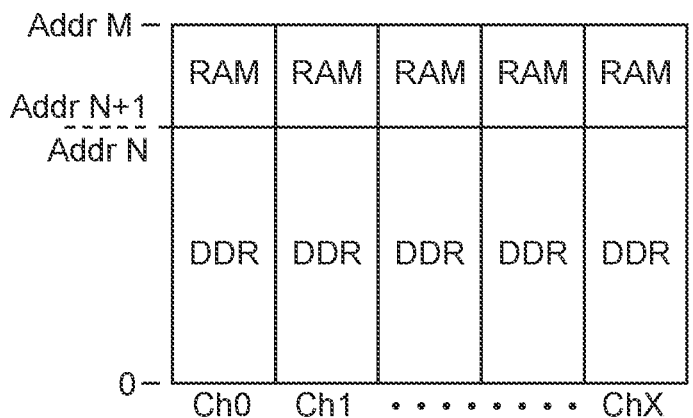
FIG. 7A is a diagram showing how the available bandwidth of the Universal Interface Bus (UIB) can be partitioned between the external memory interface and the bulk RAM using an addressable memory mapping scheme in accordance with an embodiment.

In accordance with some embodiments, the available bandwidth across the universal interface bus can be statically or dynamically partitioned between the EMIF interfaces and the bulk embedded RAM interfaces using addressable memory mapping and/or strict channel partitioning. FIG. 7A is a diagram showing how the available bandwidth of the universal interface bus between UIB 504 on main die 501 and UIB 552 on expansion die 550 is partitioned using an addressable memory mapping scheme (e.g., an addressing method in which the same address space is used to address both memory and IO devices). As shown in FIG. 7A, the universal interface bus may include X channels. In each of the X channels, addresses 0 to N may be reserved for the EMIF blocks while addresses (N+1) to M are reserved for the bulk RAM blocks.

Figure 7B:
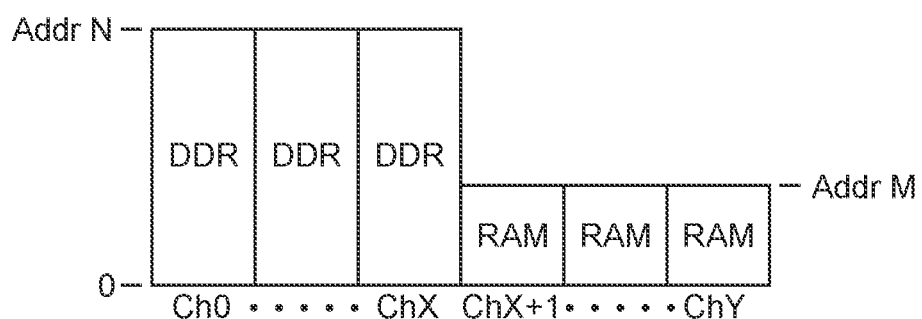
FIG. 7B is a diagram showing how the available bandwidth of the Universal Interface Bus (UIB) can be partitioned between the external memory interface and the bulk RAM using a strict channel partitioning scheme in accordance with an embodiment.

FIG. 7B shows another example where the available bandwidth of the universal interface bus between UIB 504 on main die 501 and UIB 552 on expansion die 550 is partitioned using a strict channel partitioning scheme (e.g., an addressing method in which a first portion of channels is strictly reserved for memory and a second portion of channels is strictly reserved for other IO devices). As shown in FIG. 7B, the universal interface bus may include Y channels. In channels 0 to X (assuming X is less than Y), addresses 0 to N may be used strictly for EMIF blocks. In channels (X+1) to Y, addresses 0 to M may be used strictly for bulk RAM blocks.

Figure 7C:
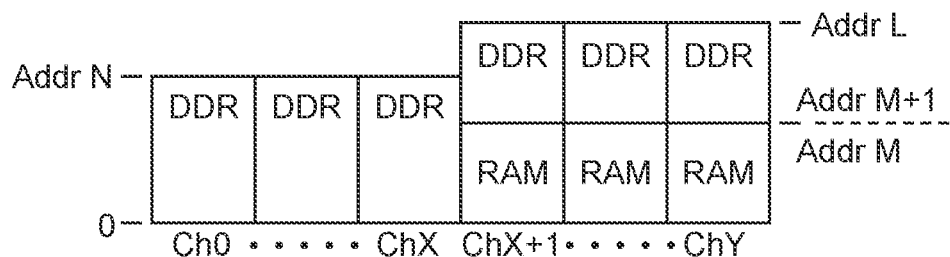
FIG. 7C is a diagram showing how the available bandwidth of the Universal Interface Bus (UIB) can be partitioned between the external memory interface and the bulk RAM using a hybrid scheme in accordance with an embodiment.

FIG. 7C shows yet another example where the available bandwidth of the universal interface bus between UIB 504 on main die 501 and UIB 552 on expansion die 550 is partitioned using a hybrid partitioning scheme (e.g., an addressing method in which a first portion of channels is strictly reserved for memory and a second portion of channels uses an addressable memory mapping scheme). As shown in FIG. 7C, the universal interface bus may include Y channels. In channels 0 to X (assuming X is less than Y), addresses 0 to N may be used strictly for EMIF blocks. In channels (X+1) to Y, addresses 0 to M may be reserved for bulk RAM blocks while addresses (M+1) to L are reserved for EMIF blocks. This is merely illustrative. If desired, channels 0 to X might be used strictly for bulk RAM blocks. In general, any suitable combination of IO components and partitioning method can be supported by the UIB.

Figure 8:
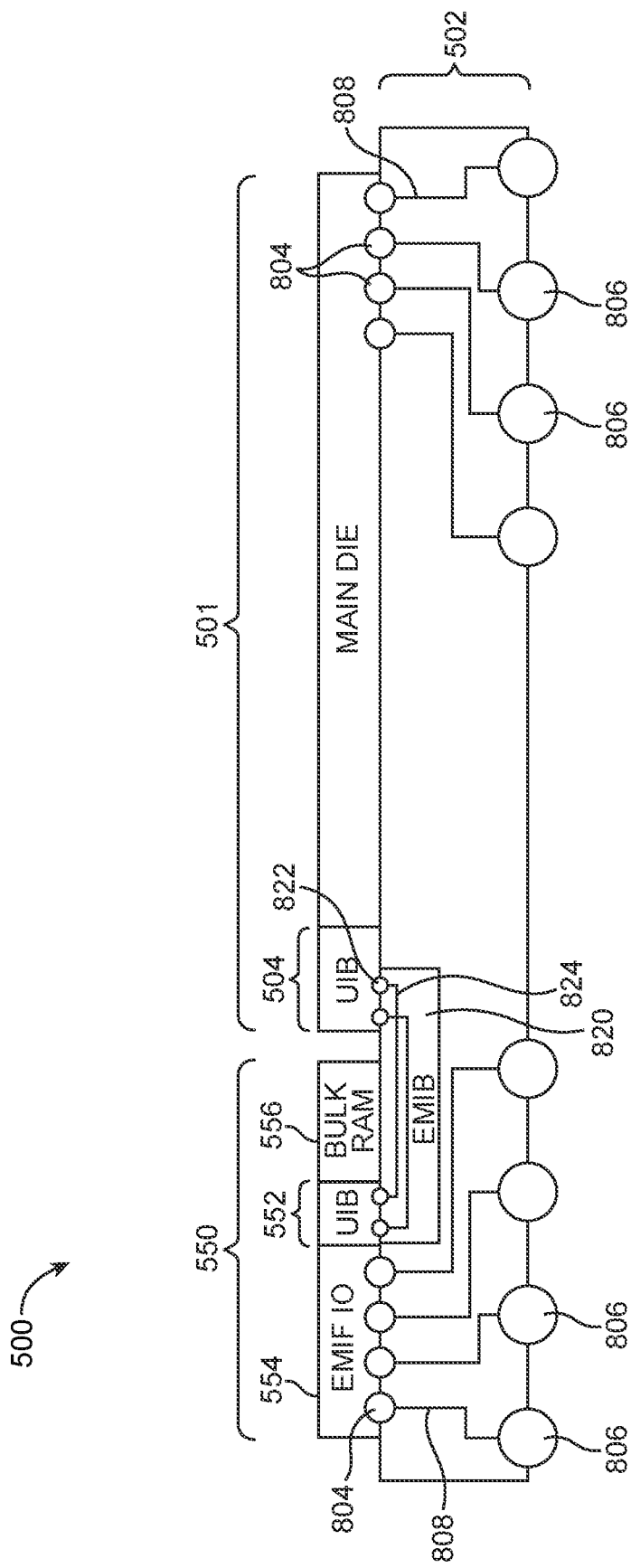
FIG. 8 is a cross-sectional side view of an illustrative multichip package of the type shown in FIG. 5A or 5B showing how the main die communicates with the expansion tile in accordance with an embodiment.

FIG. 8 shows a cross-sectional side view of multichip package 500 of the type described in connection with FIG. 5A or FIG. 5B. As shown in FIG. 8, package 500 may include semiconductor substrate 500 (or optionally an interposer), main die 501 mounted on substrate 502, and expansion die 550 mounted on substrate 502. Package 500 may also include other daughter dies, which are not shown in FIG. 8 so as to not obscure the present embodiments.

Flip-chip (otherwise known as controlled collapse chip connection or "C4") bumps 804 may be formed between substrate 502 and the various dies 501 and 550 mounted on substrate 502. An array of solder balls 806 (sometimes referred to collectively as a ball grid array or "BGA") may be formed at the bottom surface of package substrate 502. Multichip package 500 formed in this way may then be mounted on a printed circuit board (PCB) to communicate with other devices in a larger system.

Input-output components on main die 501 such as slim external IO blocks 512 and EMIF IO blocks 508 may be coupled to corresponding off-package devices through bumps 804, package traces 808, and solder balls 806. In accordance with an embodiment, UIB 504 of main die 501 may communicate with UIB 552 of expansion tile 550 using an Embedded Multi-Die Interconnect Bridge (EMIB) solution that is designed and patented by INTEL Corporation. As shown in FIG. 8, EMIB 820 is a small silicon chip that is embedded in the underlying package substrate 502 and offers dedicated ultra-high-density interconnection between dies within multichip package 500. EMIB 820 may generally include short wires such as wires 824, which help to significantly reduce loading at output drivers and directly boost performance. The mesh of short wires 824 within EMIB 820 may be coupled to smaller solder bumps such as microbumps 822, which exhibits reduced pitch and therefore offers denser interconnectivity relative to flip-chip bumps 804. In general, UIB 504 may occupy a smaller footprint on the main die due to the smaller pitch of the microbumps 822. EMIF interfaces supporting DDR/QDR would have a significantly larger footprint in comparison. Thus, UIB 504 can provide high bandwidth while consuming less shoreline.

In the example of FIG. 8, expansion tile 550 includes both EMIF IO circuitry 554 and bulk RAM circuitry 556 (see, e.g., FIG. 6A). Circuitries 554 and 556 on expansion die 550 may both communicate with main die 501 using UIB 552 and EMIB 820. EMIF IO blocks 554 may be coupled to corresponding off-package devices through bumps 804, package traces 808, and solder balls 806. As already described above, the IO/RAM expansion die 550 can be readily swapped with an HBM DRAM stack to allow for a myriad of different die-package combinations to meet specific market needs.

In general, all package interfaces between any two in-package components (see, e.g., FIG. 5A or 5B, interface 509 between IO blocks 508 and transceiver dies 510, the universal interface bus between UIB 504 and HBM die 506, the universal interface bus between UIB 504 and expansion tile 550, etc.) can be implemented using the EMIB or other similar high-density/high-performance on-package routing technology. EMIB solutions may be advantageous over other multi-chip packaging schemes that use a silicon interposer, which may be prone to issues such as warpage and requires a comparatively large number of microbumps and through-silicon vias (TSVs) to be formed on and within the interposer, thereby reducing overall yield and increasing manufacturing complexity and cost. The number of dies that can be integrated using an interposer is also limited relative to that supported by EMIB technology.

EXAMPLES

The following examples pertain to further embodiments.

Example 1 is a multichip package, comprising: a substrate; and an integrated circuit die mounted on the substrate, wherein the integrated circuit die has a periphery, wherein the integrated circuit die comprises a universal interface block formed along the periphery of the integrated circuit die, wherein the universal interface block is operable to communicate with at least an on-package memory die and an on-package expansion die, and wherein the on-package expansion die includes external memory interface (EMIF) components configured to communicate with memory devices external to the multichip package.

Example 2 is the multichip package of example 1, wherein the on-package expansion die is optionally mounted on the substrate, and wherein the external memory interface components on the on-package expansion die are optionally configured to support double date rate (DDR) or quad data rate (QDR) external memory interfaces.

Example 3 is the multichip package of example 2, wherein the on-package expansion die optionally further includes bulk random-access memory components.

Example 4 is the multichip package of example 3, wherein the bulk random-access memory components optionally comprise static random-access memory (SRAM) blocks.

Example 5 is the multichip package of any one of examples 3-4, wherein the integrated circuit die optionally further comprises: additional bulk random-access memory components formed along the periphery of the integrated circuit die.

Example 6 is the multichip package of any one of examples 2-5, wherein the integrated circuit die optionally further comprises: additional external memory interface components formed along the periphery of the integrated circuit die, wherein the additional external memory interface components are also configured to communicate with memory devices external to the multichip package.

Example 7 is the multichip package of any one of examples 1-6, wherein the interface between the on-package expansion die and the universal interface block on the integrated circuit die is optionally implemented using an embedded multi-die interconnect bridge formed in a top surface of the substrate.

Example 8 is the multichip package of any one of examples 1-7, wherein the on-package memory die is optionally mounted on the substrate, and wherein the on-package memory die is optionally configured to offer higher bandwidth than the external memory interface components.

Example 9 is the multichip package of any one of examples 1-8, wherein the integrated circuit die optionally further comprises: core routing fabric formed within its periphery; and general purpose input-output (GPIO) or low-voltage differential signaling (LVDS) buffers formed within the core routing fabric, wherein the GPIO and LVDS buffers are configured to provide a clock source for the core routing fabric, and wherein there is no external memory interface (EMIF) components formed within the core routing fabric.

Example 10 is the multichip package of any one of examples 1-9, optionally further comprising: a transceiver die coupled to a corresponding transceiver interface block on the integrated circuit die, wherein the transceiver die is configured to communicate with off-package devices at data rates exceeding 10 Gbps.

Example 11 is circuitry, comprising: a package substrate; a main die mounted on the package substrate; a memory die mounted on the package substrate, wherein the memory die is coupled to a first universal interface block in the main die; and an expansion die mounted on the package substrate, wherein the expansion die is coupled to a second universal interface block in the main die, wherein the first and second universal interface blocks are structurally identical, and wherein the expansion die includes external memory interface (EMIF) blocks configured to communicate with off-package memory devices that are not mounted on the package substrate.

Example 12 is the circuitry of example 11, optionally further comprising: a transceiver die mounted on the package substrate, wherein the transceiver die is configured to communicate with off-package devices at data rates exceeding 50 Gbps.

Example 13 is the circuitry of any one of examples 11-12, wherein the expansion die further optionally comprises bulk random-access memory (RAM) blocks.

Example 14 is the circuitry of example 13, wherein the first and second universal interface blocks are formed at peripheral edges of the main die, and wherein the main die optionally further comprises: core routing fabric formed within its peripheral edges, wherein there is no external memory interface (EMIF) blocks formed through the core routing fabric.

Example 15 is the circuitry of example 14, wherein the main die optionally further comprises additional external memory interface components formed along the peripheral edges of the main die or embedded static random-access memory components formed along the peripheral edges of the main die.

Example 16 is an integrated circuit die, comprising: a periphery; a transceiver interface block formed along the periphery, wherein the transceiver interface block is configured to communicate with a transceiver die formed within the same package as the integrated circuit die; and a universal interface block formed along the periphery, wherein the universal interface block is operable to communicate with a memory die formed within the same package as the integrated circuit die and with an expansion die formed within the same package as the integrated circuit die, and wherein the integrated circuit die offloads at least some peripheral input-output components onto the expansion die.

Example 17 is the integrated circuit die of example 16, wherein the expansion die optionally comprises bulk random-access memory (RAM) circuitry.

Example 18 is the integrated circuit die of example 17, wherein the expansion die optionally further comprises external memory interface (EMIF) circuitry.

Example 19 is the integrated circuit die of example 18, wherein the interface between the universal interface block and the expansion die has a bandwidth that is optionally partitioned between the EMIF and bulk RAM circuities using an addressable memory mapping scheme.

Example 20 is the integrated circuit die of example 18, wherein the interface between the universal interface block and the expansion die has a bandwidth that is optionally partitioned between the EMIF and bulk RAM circuities using a strict channel partitioning scheme.

For instance, all optional features of the apparatus described above may also be implemented with respect to the method or process described herein. The foregoing is merely illustrative of the principles of this disclosure and various modifications can be made by those skilled in the art. The foregoing embodiments may be implemented individually or in any combination.

What is claimed is:

1. A multichip package comprising:
   a substrate;
   a processor die mounted on the substrate, wherein the processor die comprises a periphery and a universal interface block formed along the periphery; and
   an external I/O die mounted on the substrate, wherein the external I/O die is communicatively coupled to the processor die via the universal interface block, wherein the external I/O die comprises external memory interface (EMIF) circuitry configured to communicate with off-package memory via the EMIF circuitry.

2. The multichip package of claim 1, wherein:
   the processor die is fabricated using a first process technology;
   the external I/O die is fabricated using a second process technology; and
   the first process technology is different than the second process technology.

3. The multichip package of claim 2, wherein the processor die comprises cache memory.

4. The multichip package of claim 3, wherein the multichip package does not comprise an on-package memory die.

5. The multichip package of claim 3, wherein the cache memory comprises a plurality of caches.

6. The multichip package of claim 2, wherein the EMIF circuitry is configured to support double data rate (DDR) external memory interfaces.

7. The multichip package of claim 2, wherein the EMIF circuitry is configured to support quad data rate (QDR) external memory interfaces.

8. The multichip package of claim 2, wherein the EMIF circuitry comprises a memory controller.

9. The multichip package of claim 2, comprising a plurality of universal interface blocks disposed on a single die.

10. The multichip package of claim 9, wherein the plurality of universal interface blocks is positioned along one shoreline of the single die.

11. The multichip package of claim 2, wherein the multichip package is configured to support eight double data rate (DDR) memory channels to the off-package memory.

12. The multichip package of claim 2, wherein the processor die comprises a plurality of processing elements configured to process data.

13. A processor comprising:
   a substrate;
   a processor die mounted on the substrate, wherein:
      the processor die comprises a periphery and a universal interface block formed along the periphery; and
      the processor die is fabricated using a first process technology; and
   an external I/O die mounted on the substrate, wherein:
      the external I/O die is communicatively coupled to the processor die via the universal interface block;
      the external I/O die comprises external memory interface (EMIF) circuitry configured to communicate with external memory via the EMIF circuitry; and
      the external I/O die is fabricated using a second process technology that is different than the first process technology.

14. The processor of claim 13, wherein the EMIF circuitry is configured to support double data rate (DDR) type-3 (DDR3) memory interfaces, low power DDR3 (LPDDR3) memory interfaces, DDR type-4 (DDR4) memory interfaces, low power DDR4 (LPDDR4) memory interfaces, DDR type-5 (DDR5) memory interfaces, quad data rate (QDR) memory interfaces, Open NAND Flash Interface (ONFI) memory interfaces, or a combination thereof.

15. The processor of claim 13, comprising a plurality of universal interface blocks positioned along a single shoreline of a single die of the processor.

16. The processor of claim 13, wherein the processor die comprises cache memory that includes a plurality of memory blocks.

17. A multi-die electronic device comprising:
   a substrate;
   a processor die mounted on the substrate, wherein the processor die comprises:
      a periphery;
      a universal interface block formed along the periphery;
      a plurality of processing elements configured to process data; and
      a plurality of memory blocks; and
   an external I/O die mounted on the substrate, wherein:
      the external I/O die is communicatively coupled to the processor die via the universal interface block;
      the external I/O die comprises external memory interface (EMIF) circuitry configured to support double data rate (DDR) external memory interfaces; and
      the external I/O die is configured to communicate with external memory via the EMIF circuitry.

18. The multi-die electronic device of claim 17, wherein the multi-die electronic device comprises nine dies mounted on the substrate.

19. The multi-die electronic device of claim 18, wherein the EMIF circuitry comprises a memory controller.

20. The multi-die electronic device of claim 19, wherein:
   the processor die is fabricated using a first process technology;
   the external I/O die is fabricated using a second process technology; and
   the first process technology is different than the second process technology.

* * * * *